United States Patent [19]

Newman

[11] Patent Number: 5,490,324
[45] Date of Patent: Feb. 13, 1996

[54] METHOD OF MAKING INTEGRATED CIRCUIT PACKAGE HAVING MULTIPLE BONDING TIERS

[75] Inventor: Keith G. Newman, Sunnyvale, Calif.

[73] Assignee: LSI Logic Corporation, Milpitas, Calif.

[21] Appl. No.: 121,675

[22] Filed: Sep. 15, 1993

[51] Int. Cl.6 .................................................. H05K 3/36
[52] U.S. Cl. ......................... 29/830; 174/52.4; 257/686; 257/700; 437/207; 437/209
[58] Field of Search .................................. 437/209, 207; 29/840, 827, 830; 174/52.4; 257/686, 700

[56] References Cited

U.S. PATENT DOCUMENTS

| | | | |
|---|---|---|---|
| 3,754,070 | 8/1973 | Dunn et al. | 437/207 X |
| 4,513,355 | 4/1985 | Schroeder et al. | 174/52.4 X |
| 4,633,573 | 1/1987 | Scherer | 437/209 |
| 4,688,152 | 8/1987 | Chia . | |
| 4,822,550 | 4/1989 | Komathu . | |
| 4,868,349 | 9/1989 | Chia . | |
| 4,935,581 | 6/1990 | Komathu . | |
| 5,012,386 | 4/1991 | McShane et al. | 257/700 X |
| 5,130,889 | 7/1992 | Hamburgen et al. | 174/52.4 X |
| 5,159,750 | 11/1992 | Dutta et al. | 174/52.4 X |
| 5,197,183 | 3/1993 | Chia et al. | 29/827 |
| 5,218,759 | 6/1993 | Juskey et al. . | |

FOREIGN PATENT DOCUMENTS

| | | | |
|---|---|---|---|
| 55-115351 | 9/1980 | Japan | 257/700 |
| 2199182 | 6/1988 | United Kingdom | 257/700 |

Primary Examiner—Carl J. Arbes

[57] ABSTRACT

An integrated circuit package, as well as a method for fabricating the same, is herein disclosed. The integrated circuit package of the present invention includes a cavity located within an assembly of laminated printed wiring boards. Such cavity provides two or more bonding tiers for connection with a semiconductor die. The contact pads are further connected, through conductive vias, to external connection means such as solder balls or pins. The semiconductor die is encapsulated with a molding compound through a transfer molding process. The present invention is especially advantageous in manufacturing pin grid array ("PGA") and ball grid array ("BGA")integrated circuit packages.

11 Claims, 8 Drawing Sheets

METHOD OF MAKING INTEGRATED CIRCUIT PACKAGE HAVING MULTIPLE BONDING TIERS

FIELD OF THE INVENTION

This invention relates generally to the fabrication of integrated circuit packages. More particularly, the present invention relates to the fabrication of integrated circuit packages having multiple bonding tiers for facilitating connections with a semiconductor die, where the integrated circuit package is encapsulated with molding compound.

BACKGROUND OF THE INVENTION

Semiconductor Dies; In General

Improved methods for miniaturization of semiconductor dies have permitted the integration of millions of transistor circuit elements into a single silicone embodied circuit. Such a circuit is typically referred to as an integrated circuit chip or a semiconductor die.

Semiconductor dies are created from a silicon wafer through the employment of various etching, doping and depositing steps that are well known in the art. Ultimately, the semiconductor die is encapsulated so as to form an "integrated circuit package" having a variety of pin-out or mounting and interconnection schemes. For convenience, an integrated circuit package is hereinafter referred to as an "IC package." More sophisticated IC packages have been developed for very large scale integration ("VLSI") semiconductor dies that can accommodate the increased number of external connections required with an electronic system.

PGA and BGA Packaging

VLSI integrated circuit packages having high connection capacity are, for example, pin grid array ("PGA") and ball grid array ("BGA") type packages. Both PGA and BGA type packages, including adaptations thereof for surface mount and hybrid applications, employ one or more printed wiring boards (hereinafter referred to as "PWBs"). Such PWBs consist of, for example, polyimide, glass reinforced epoxy, ceramics, or other materials known to those skilled in the art of fabricating very large scale IC packages. Some of the PWBs have material cut out from the middle which when laminated together form a cavity in which the semiconductor die may be placed.

The PGA and BGA packages differ mainly in that a PGA package utilizes conductive metal pins that may be either soldered to a system printed circuit board or inserted into a matching socket which is already soldered to the system printed circuit board. In contrast, BGA packages utilize "solder balls" instead of metal pins. The solder balls of a BGA package reflow to connection points on a system printed circuit board when heated to a certain temperature, thus, electrically connecting the circuitry within the BGA IC package to an external electronic system.

Connections are made from bond pads of a semiconductor die to contact pads of PWBs, and then to conductive metal patterns of the PWBs. Conductive metal patterns further connect to either the connection pins or connection solder balls of the PGA or BGA package, respectively. Thus, the PGA or BGA package is a miniature multi-layer printed circuit board system containing the semiconductor die and forming a housing for protection of the die. The semiconductor die is further protected by an encapsulant such as plastic or epoxy material.

Examples of semiconductor die fabrication for VLSI IC packages are more fully illustrated in co-pending U.S. patent application Ser. No. 07/917,894 entitled "Ball Bump Grid Array Semiconductor Packages" by Michael Rostoker, Chok J. Chia, Mark Schneider, Michael Steidl, Edwin Fulcher and Keith Newman, filed on Jul. 21, 1992, and assigned to LSI Logic Corporation, the disclosure of which is incorporated by reference herein for all purposes.

Single Tier Packages Formed by Plastic Molding Techniques

Currently known IC packages, which are packaged by plastic molding techniques, provide for a "single bonding tier." A typical BGA type IC package having a single bonding tier is illustrated in FIG. 1. Referring to FIG. 1, IC package 100 is illustrated. IC package 100 includes a semiconductor die as indicated by reference numeral 102.

Semiconductor die 102 is disposed on die pad 108. Die pad 108 is centrally placed upon PWB 104. Thermal vias 112 serve to dissipate the heat generated from semiconductor die 102. Semiconductor die 102 has bond pads 110 on its face for connection therewith. Bond wires 114 extend from bond pads 110 to related contact pads (not illustrated) that are disposed on PWB 104.

PWB 104 has a layer of traces disposed on its top surface. Such traces are denoted by top side layer 106. Top side layer 106 connects contact pads (not illustrated) of PWB 104 to conductive vias 116 that are located near the periphery of PWB 104. Vias 116 extend from top side layer 106, through PWB 104 to a layer of traces located on the bottom side of PWB 104. The bottom side layer is indicated by reference numeral 120. In this manner, signals to and from semiconductor die 102 are passed through bond pads 110, through bond wires 114, through contact pads of PWB 104, through top side layer 106, through vias 116, to bottom side layer 120.

Bottom side layer 120 further connects with sites (also referred to as "pads") as indicated by reference numeral 122. In turn, sites 122 are coupled to solder balls 124. Solder balls 124 are the points at which IC package 100 is connected with external circuitry. Semiconductor die 102, as well as the connections deriving therefrom, are encapsulated with molding compound 118.

Referring to FIG. 2, a bottom view of IC package 100 is illustrated. A bottom view of IC package 100 reveals bottom side layer 120. Bottom side layer 120 is composed of a series of traces. Such traces are indicated by reference numerals 202. Traces 202 originate at vias 116, which are located on the periphery of PWB 104, and terminates at sites 122. Sites 122 are arranged in a rectangular array of evenly spaced rows and columns. As best viewed in FIG. 1, each site 122 is provided with a solder ball 124. Solder balls 124 constitute the external connections for IC package 100. Bottom side layer 120 also includes ground plane 204, with connected ground vias 206, in order to supply semiconductor die 102 with a ground potential.

A package having a single PWB, as exemplified by IC package 100, only provides for connections between a semiconductor die and a PWB to be made on one surface or plane. Such a surface is referred to as a single bonding tier. Single bonding tiers are also found in IC packages having multiple PWBs. That is, multiple PWBs can be laminated directly above one another. Connections between the multiple PWBs and a semiconductor die are established on the top surface of the top level PWB.

A single bonding tier fails to satisfactorily accommodate a substantial number of connections between a semiconductor die and one or more PWBs. A single bonding tier requires contact pads, which are to be connected to a semiconductor die, to be placed in an array on a single surface that surrounds the semiconductor die. When a substantial number of contact pads are involved, however, the perimeter of this array of contact pads becomes relatively large. Consequently, long bond wires must be utilized to complete connections between the semiconductor die and the distant array of contact pads. The use of an enlarged semiconductor die, to extend to the array of contact pads, is disadvantageous and thus not a solution.

An array of contact pads can include the placement of contact pads in a single strip that surrounds a semiconductor die. Alternatively, an array of contact pads can consist of multiple strips of contact pads that are interleaved with respect to one another. The employment of multiple strips of contact pads results, however, in severe via routing constraints.

A further disadvantage is encountered with a single bonding tier. Ideally, bond wires travel from a bond pad to a corresponding contact pad in a path that is perpendicular to the periphery of the semiconductor die. That is, each bond pad ideally has a contact pad directly across from it so that all bond wires are parallel with one another. This is difficult, if not impossible, to accomplish when a substantial number of contact pads are placed in an array on a single bonding tier. Due to the width of each contact pad in the array, bond wires must "fan out" at significant angles from one another to connect the smaller bond pads with the wider contact pads. Such a significant "effective pitch" between bond wires is undesirable and preferably reduced.

Accordingly, IC packages which require a substantial number of connections between a semiconductor die and one or more PWBs, are not accommodated through a single bonding tier.

Multiple Bonding Tiers

In order to overcome the shortcomings of a single bonding tier, multiple bonding tiers have been employed. An IC package having multiple bonding tiers is constructed by indenting multiple PWBs from one another. IC packages having multiple bonding tiers have been conventionally formed by fully encapsulating the cavity, wherein the semiconductor die is disposed, with a "glob-top" encapsulant. In particular, a "glob top" encapsulant of epoxy is often employed to fully encapsulate a cavity. IC packages with multiple bonding tiers have also been formed by placing a ceramic lid over an unencapsulated (where an epoxy seal is applied to the ceramic lid) or partially encapsulated cavities (where a conformal coating is used to coat the semiconductor die). Such unencapsulated and partially encapsulated IC packages are, however, more susceptible to reliability failure (due to the collection of moisture) and have poor thermal attributes when compared to those which are fully encapsulated with epoxy.

IC packages, which have multiple bonding tiers and are fully encapsulated with epoxy, suffer from several shortcomings which are desired to be alleviated or reduced. First, epoxy encapsulated IC packages are difficult and time consuming to manufacture. As a consequence, the cost of manufacturing IC packages that have multiple bonding tiers and an epoxy encapsulant is relatively high. Second, voids of air are difficult to remove from an epoxy encapsulant. Moisture, which tends to collect in unremoved air voids, can result in mechanical failures such as cracking and catastrophic fatigue, as well as other failures such as corrosion. Third, epoxy encapsulated IC packages lack well defined uniform geometries and dimensions. This results from the shrinking of epoxy when it is cured so that the final shape of the epoxy encapsulated IC package is difficult to control. Uniform geometries and dimensions are, however, necessary for proper handling, installation, testing and fixturing of an IC package. Fourth, the depth or thickness of IC packages is difficult to control when encapsulated with epoxy. IC package thickness is critical for applications such as memory cards and micro-miniature products, as well as for situations where metal pins and balls (of PGA and BGA packages, respectively) require certain clearances or where an IC package requires a certain elevation ("stand-off") from a system printed circuit board.

In sum, IC packages that have a single bonding tier fail to accommodate a substantial number of connections between a semiconductor die and multiple PWBs. Moreover, currently known IC packages that have multiple bonding tiers suffer from several shortcomings that are associated with epoxy encapsulants. Thus, what is needed is an IC package that can accommodate a substantial number of connections from a semiconductor die, while being readily and cost efficiently manufactured, substantially free of air voids, with uniform dimensions and geometries and in variable thicknesses.

SUMMARY OF THE INVENTION

Accordingly, it is an object of the present invention to provide an IC package which can accommodate a substantial number of connections between a semiconductor die and an assembly of multiple PWBs.

Another object of the present invention is to facilitate the manner of interconnecting a semiconductor die with multiple PWBs. This includes allowing such interconnections to follow paths which traverse one another.

Still another object of the present invention is to minimize the distance required for connections between a semiconductor die and multiple PWBs.

Yet another object of the present invention is to minimize the effective pitch between connections of a semiconductor die and multiple PWBs.

A further object of the present invention is to enable the utilization of a semiconductor die of a minimal size.

Another object of the present invention is to facilitate the manufacture and thus reduce the cost of IC packages having multiple bonding tiers.

Still another object of the present invention is to provide an IC package, having multiple bonding tiers, which is substantially free of air voids.

Yet another object of the present invention is to provide an IC package, having multiple bonding tiers, which possesses a well defined uniform geometry and dimensions.

A further object of the present invention is to provide an IC package, having multiple bonding tiers, which possesses a minimal depth or thickness.

The present invention accomplishes these objects, in addition to other objects that will be described in the drawings and detailed specification below.

According to the present invention, an IC package is fabricated to include multiple bonding tiers or shelves. Each bonding tier provides a substantially rectangular strip whereon contact pads can be placed. The bonding tiers are arranged in a step-like configuration such that the farther a bonding tier is away from the semiconductor die, the higher the elevation of the bonding tier. A semiconductor die is centrally disposed within the tiered arrangement of bonding tiers. Accordingly, electrical connections are readily made from the semiconductor die to each bonding tier by a conductor such as a bond wire.

The multiple bonding tiers are formed by utilizing two or more PWBs. A first PWB, having a first set of contact pads, is arranged around the periphery of a semiconductor die. That is, the first PWB provides for a first bonding tier. A second PWB is laminated to the top surface of the first PWB. The second PWB has an opening that provides for the first set of contact pads to be disposed therein. A second set of contact pads can thus be disposed on the second PWB. That is, the second PWB provides for a second bonding tier. Additional bonding tiers may be formed by continuing to laminate PWBs, having openings that are progressively larger, to the second PWB. Each PWB thus provides a distinct bonding tier or ledge where contact pads may be disposed.

A set of contact pads is disposed on each bonding tier. In particular, contact pads surround the inner periphery of each bonding tier for connection therewith. The contact pads are connected with corresponding bond pads of the semiconductor die. Such connection can be achieved by, for example, wire bonding. The contact pads connect to vias which, in turn, connect to external connection means such as metal pins or solder balls.

Multiple bonding tiers thus permit electrical connections to contact pads of the PWBs at points which are in close proximity to the semiconductor die. As a consequence, less bond wiring is required. Further, the connections between the semiconductor die and PWB are permitted to be substantially parallel to one another.

The semiconductor die and PWB, including the connections therebetween, are encapsulated by a molding compound. Preferably, a transfer molding process is employed to encapsulate a semiconductor die and portions of the tiered PWBs with molding compound.

When compared to multiple tier IC packages that are encapsulated with epoxy, the following advantages are gained by encapsulating an IC package with molding compound through a transfer molding process. First, multiple tier IC packages may be manufactured in a low cost assembly process. Further, multiple tier IC packages can be formed in the absence of air voids. Still further, multiple tier IC packages can possess well defined uniform geometries and dimensions since transfer molded IC packages experience very little distortion or shrinkage. Moreover, the thickness of multiple tier IC packages can be readily controlled so as to provide for minimal thicknesses.

Other and further objects, features and advantages will be apparent from the following description of a presently preferred embodiment of the invention, given for the purpose of disclosure and taken in conjunction with the accompanying drawings.

BRIEF DESCRIPTION OF THE DRAWINGS

The foregoing and other objects, aspects and advantages of the present invention will be better understood from the following detailed description of the preferred embodiment of the invention with reference to the accompanying drawings, in which.

DETAILED DESCRIPTION OF A PREFERRED EMBODIMENT OF THE PRESENT INVENTION

Figure 1:
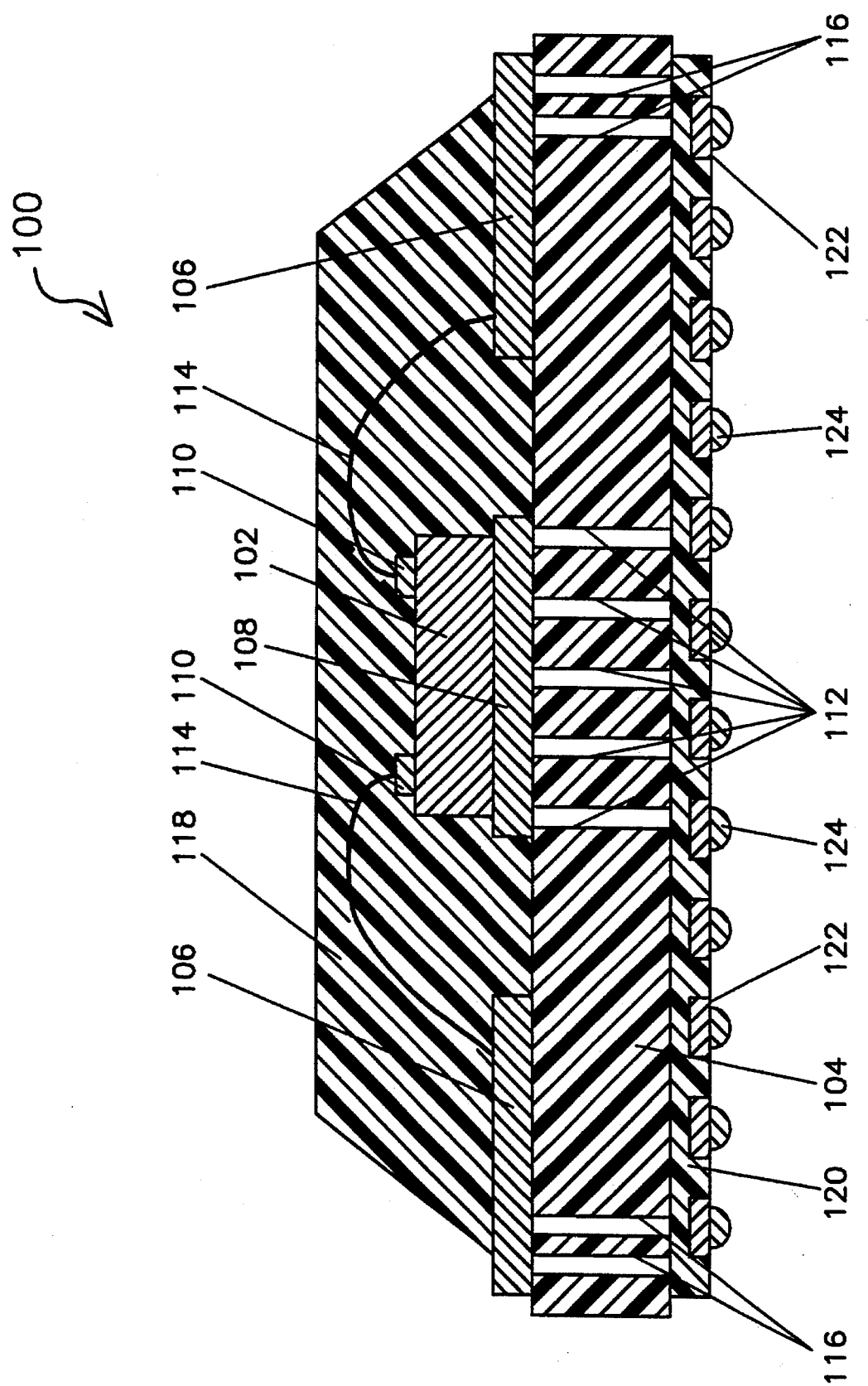
FIG. 1 is a cross-sectional view of an IC package having a single bonding tier in accordance with the prior art.
Figure 2:
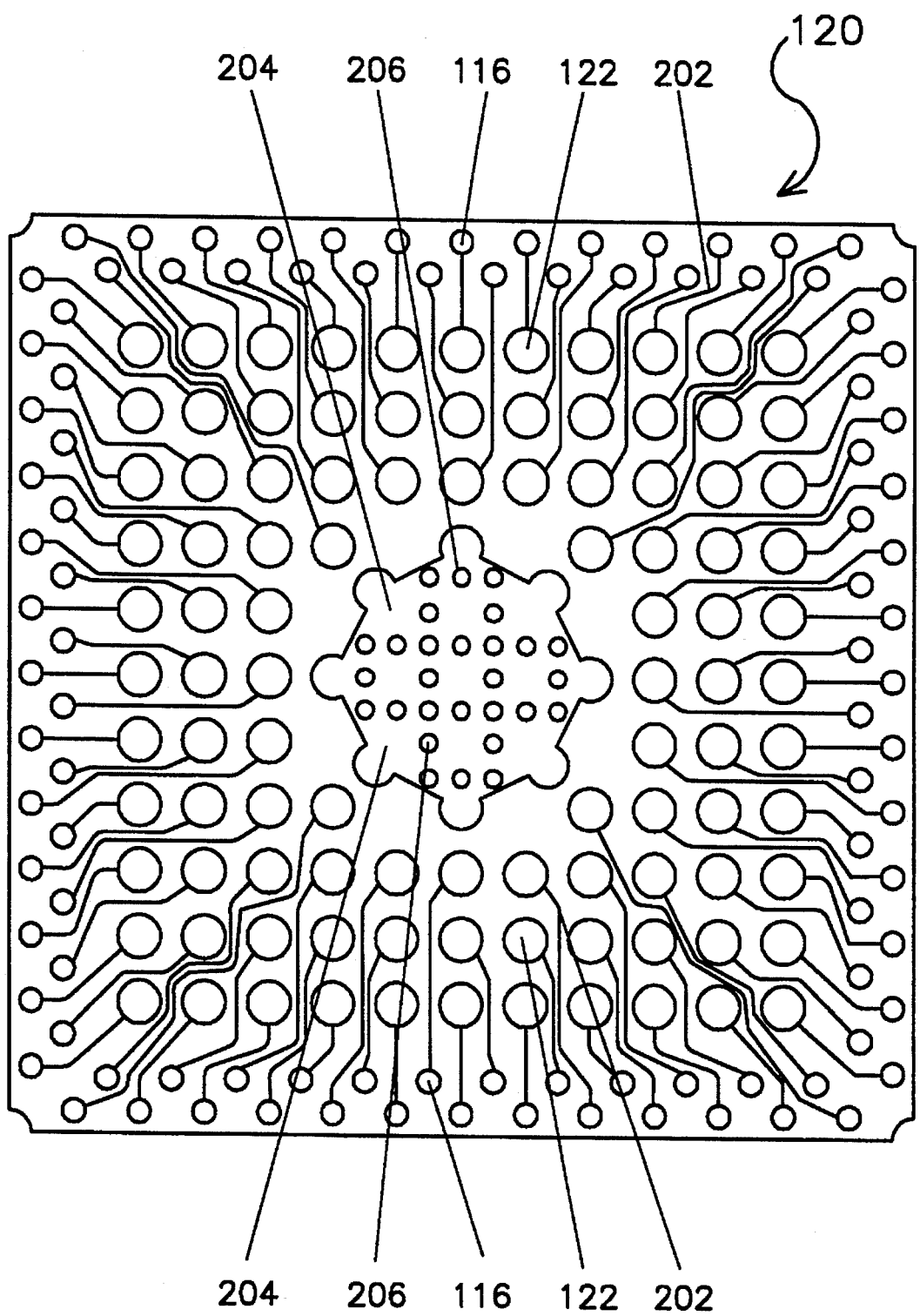
FIG. 2 is a bottom view of the IC package of FIG. 1.

Referring now to the drawings, the details of a preferred embodiment are schematically illustrated. In the drawings like elements have the same number, while similar elements have the same number with a suffix having a different lower case letter.

A semiconductor die is connected to printed wiring boards ("PWBs") by bond wires or other means well known to those skilled in the art. In particular, bond wires serve to connect the bond pads of the semiconductor die with contact pads of the PWBs. It is desirable to have each contact pad as close as possible to the bond pad on the semiconductor die with which it is connected. It is also desirable to have the effective pitch of bond wires to be as minimal as possible. In other words, it is advantageous to have the bond wires be substantially parallel with respect to one another.

When a single bonding tier is employed in conjunction with multiple PWBs, an array of contact pads must be placed on a single surface or plane. Such an array of contact pads typically possesses a substantial size perimeter. As a consequence, bond wires must fan out and extend over long distances in order to reach each of the contact pads that are arranged in array. In contrast, the present invention provides for the employment of multiple bonding tiers within an IC package. By dispersing the contact pads among multiple bonding tiers, each contact pads can be located at a closer distance to the semiconductor die. Furthermore, such dispersement allows for the effective pitch of the bond wires. The present invention forms such an IC package by encapsulation with a molding compound.

Figure 3:
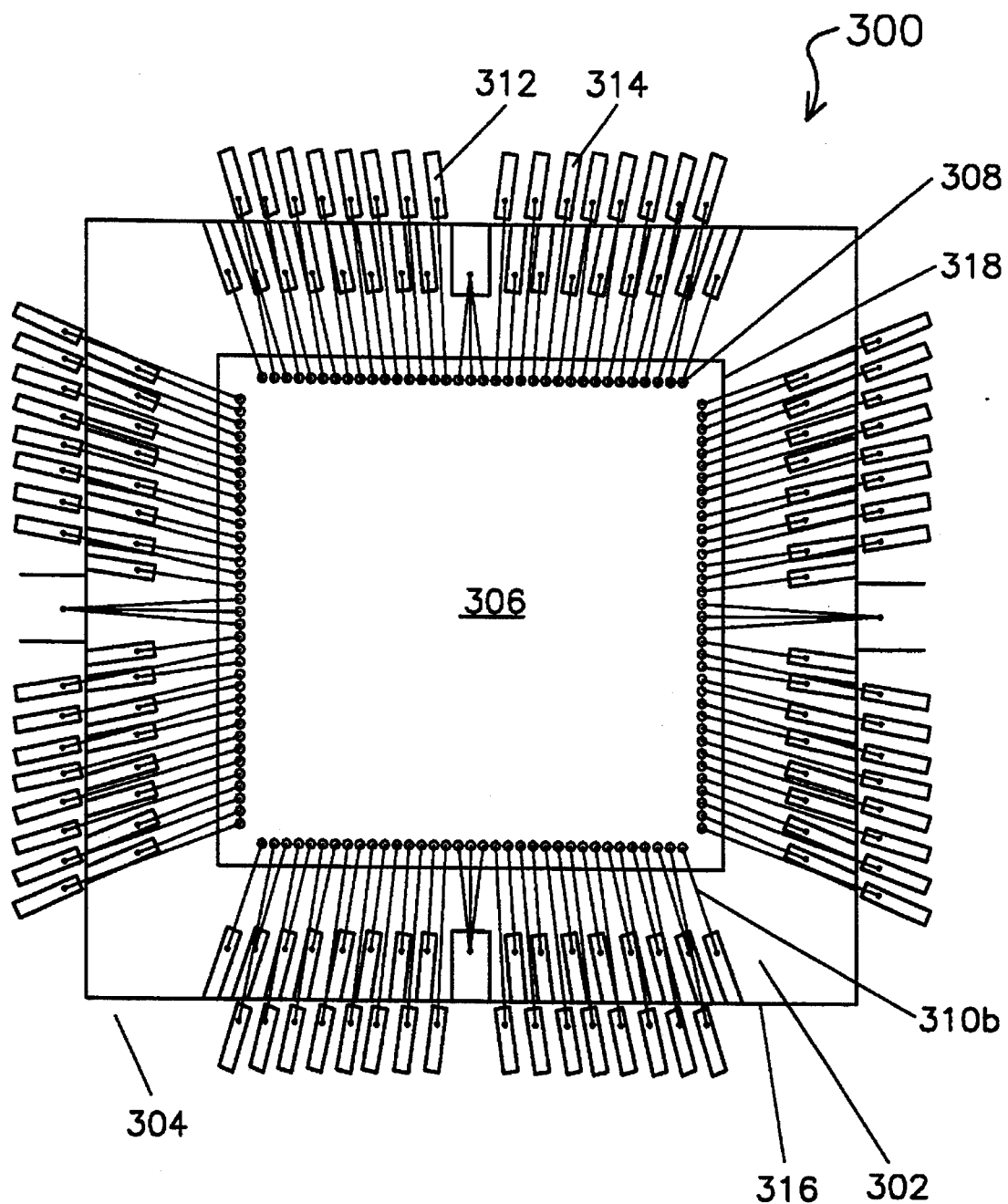
FIG. 3 is a top view of a semiconductor die assembly in accordance with a preferred embodiment of the present invention.

Referring to FIG. 3, a top view of a semiconductor die assembly, in accordance with a preferred embodiment of the present invention, is illustrated. Semiconductor die assembly 300 includes lower PWB 302 and upper PWB 304, as well as semiconductor die 306. Lower PWB 302 provides a first bonding tier. Upper PWB 304, having an opening indicated by reference numeral 316, is laminated to the top of lower PWB 302 and thus provides a second bonding tier.

Upper PWB 304 is laminated to lower PWB 302. Lower PWB 302 contains contact pads 312, whereas upper PWB 304 contains contact pads 314. The opening of upper PWB 304 is indicated by reference numeral 316. Opening 316 is formed directly around, and in close proximity with, contact pads 312 of lower PWB 302. Contact pads 314 of upper PWB 304 are placed directly behind opening 316 of upper PWB 304.

Contact pads 312 and 314 enable lower PWB 302 and upper PWB 304 to be connected to bond pads 308 of semiconductor die 306. Such connection is accomplished through bond wires 310a and 310b, respectively. Semiconductor die 306, having a periphery indicated by reference numeral 318, is preferably disposed on the top surface of lower PWB 302. Alternatively, lower PWB 302 may be formed to include a cavity wherein semiconductor die 306 may be disposed.

Had a single bonding tier been employed within semiconductor die assembly 300, contact pads 312 and 314 would have all been placed on a single surface. Accordingly, lengthy bond wires would have been required to connect each of the contact pads with semiconductor die 306. By virtue of two bonding tiers, however, contact pads 312 and 314 are placed in substantially close proximity to periphery 318 of semiconductor die 306. This enables bond wires 310a and 310b, which connect bond pads 308 with contact pads 312 and 314, respectively, to be of minimal length.

An increase in the size of a semiconductor die can be used to offset the substantial perimeter formed by an array of contact pads on a single surface. That is, a semiconductor die perimeter can be extended to meet the substantial perimeter formed the array of contact pads, thereby decreasing bond wire lengths. However, it is always advantageous to use a semiconductor die of the smallest size. Thus, increasing the size of a semiconductor die to reduce bond wire length is an undesirable alternative.

Multiple bonding tiers enable bond wires to be substantially parallel with respect to one another. In other words, the fan-out of bond wires is minimized. Since contact pads 312 and 314 are placed on distinct tiers, bond wires 310a–b can be substantially parallel to one another. This would not be the case if contact pads 312 and 314 were placed on a single bonding tier. In that case, the width of the contact pads would necessitate greater spacial separation between the connection points of each contact pad. Accordingly, the spacial separation between the connection points of each contact pad would be greater than the spatial separation between the contact points of each bond pad results. Thus, the bond wires would be at significant angles from one another. By employing multiple tiers of contact pads, the angle between bond wires 310a–b are significantly minimized to the point that they are substantially parallel to one another.

A further advantage is gained by enabling bond wires to traverse one another. Since bond wires 310a are at a different elevation than bond wires 310b, bond wires 310a and 310b can traverse one another. This results in improved flexibility when designing a semiconductor die assembly.

CAVITY UP DESIGN

Figure 4:
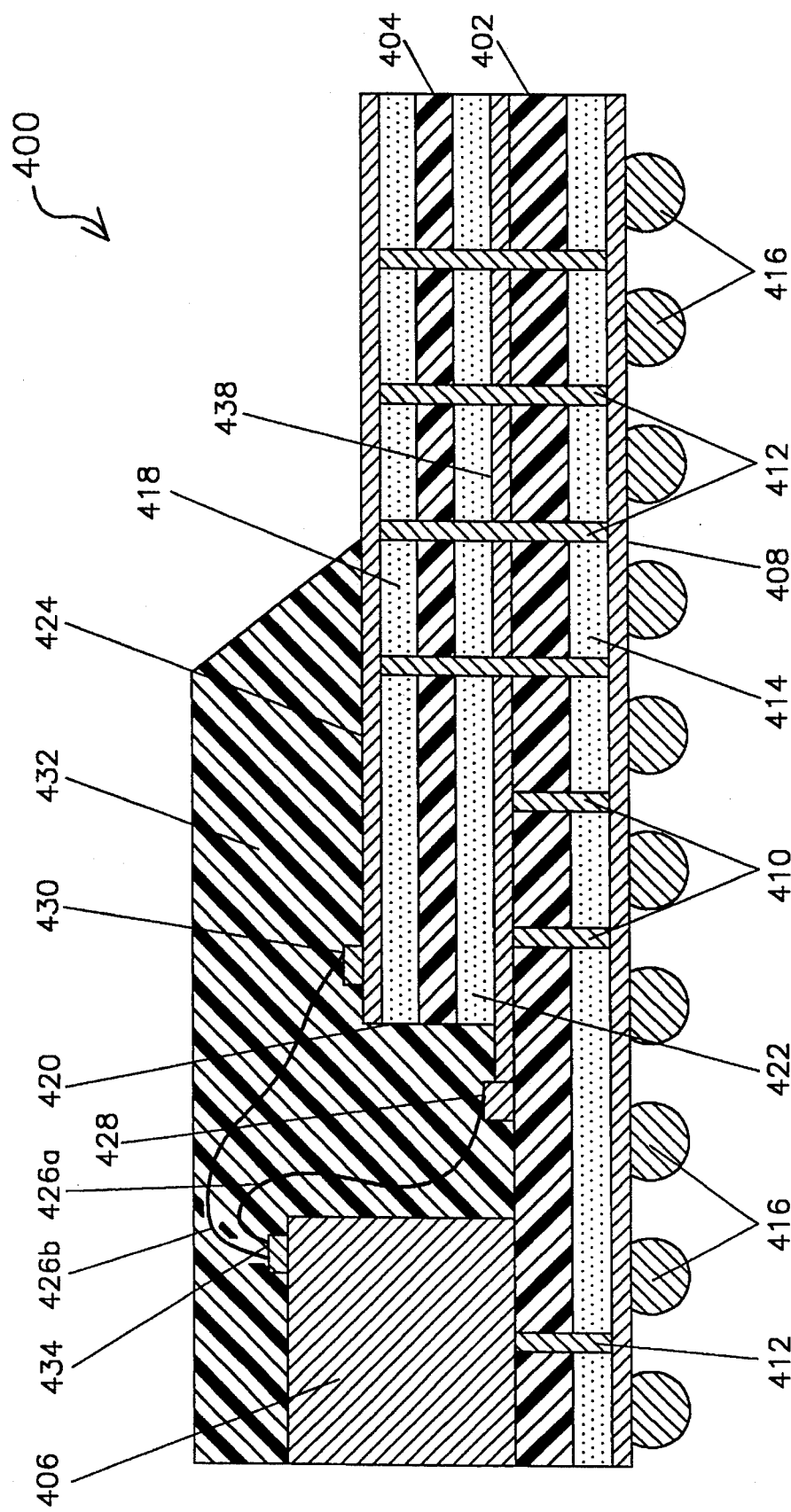
FIG. 4 is a cross-sectional view of a cavity up IC package in accordance with a preferred embodiment of the present invention.

A cavity up IC package provides external connection means that are opposite to the face of a semiconductor die. Referring to FIG. 4, a cross-sectional view of a BGA cavity up IC package is illustrated.

IC package 400 of FIG. 4 includes lower PWB 402 and upper PWB 404. Upper PWB 404, having an opening indicated by reference numeral 420, is laminated to lower PWB 402. Disposed in opening 420 of upper PWB 404 and on the top surface of lower PWB 402 is semiconductor die 406. Thermal vias 436 serve to dissipate the heat generated from semiconductor die 406.

IC package 400 further includes solder balls 416 which provide external connections to and from semiconductor die 406 as designated by solder ball attach layer 408. Preferably, solder balls 416 are employed in an array as is typical in BGA type packaging. Alternatively, solder balls 416 may be connection pins arranged in an array such as is found in typical PGA type packaging.

IC package 400 includes several adhesive layers. Lower PWB 402 is separated from solder ball attach layer 408 by means of an adhesive layer that is indicated by reference numeral 414. Lower PWB 404 is laminated to upper PWB 404 by adhesive layer 422. Adhesive layer 422 is preferably made of prepreg material, approximately 0.10 of a millimeter in thickness, that is compressed and cured. In addition, upper PWB 404 is laminated to conductive layer 424 by means of adhesive layer 418.

IC package 400 includes two bonding tiers. That is, a first bonding tier provided by the top surface of lower PWB 402, whereas a second bonding tier is provided by the top surface of adhesive layer 418 that is disposed above upper PWB 404.

Contact pads 428 are disposed on the top surface of lower PWB 402 so as to form the first bonding tier. Bond wires, as indicated by reference numeral 426a, connect bond pads 434 of semiconductor die 306 with contact pads 428. Conductive layer 438, which is disposed on the top surface of lower PWB 402, serves to connect contact pads 428 with an array of vias designated by reference numerals 410. Vias 410 serve to further connect contact pads 428 with solder ball attach layer 408. Accordingly, signals to and from semiconductor die 406 are passed through bond pads 434, through bond wires 426a, through contact pads 428, through conductive layer 438, through vias 410, to solder ball attach layer 408, and then finally to solder balls 416.

Similarly, contact pads 430 are disposed on the top surface of adhesive layer 418 so as to form the second bonding tier. Bond wires, as indicated by reference numerals 426b, connect bond pads 434 of semiconductor die 406 with contact pads 430. Conductive layer 424 serves to connect contact pads 430 with an array of vias designated by reference numerals 412. Vias 412 serve to further connect contact pads 430 with solder ball attach layer 408. Accordingly, signals to and from semiconductor die 406 are passed through bond pads 434, through bond wires 426b, through contact pads 430, through conductive layer 424, through vias 412, to solder ball attach layer 408, and then finally to solder bails 416.

IC package 400 is encapsulated by molding compound 432. This is preferably accomplished by a transfer molding process as further described below.

Figure 4A:
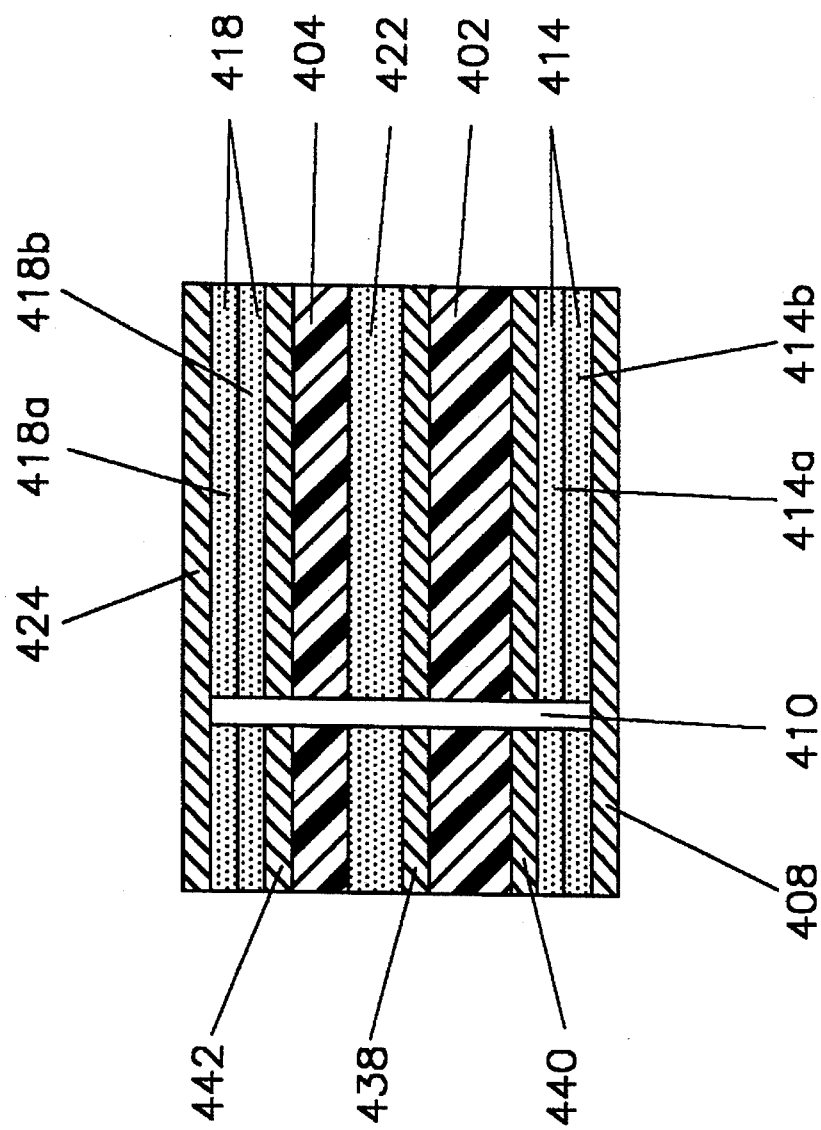
FIG. 4b is expanded view of the various layers of the cavity up IC package of FIG. 4.

Referring to FIG. 4a, a detailed cross-sectional view of the various layers of IC package 400 is illustrated. Beneath conductive layer 424 lies adhesive layer 418. Preferably, adhesive layer 418 is composed of two prepreg layers of 0.06 millimeter thickness. These prepreg layers are indicated by reference numerals 418a and 418b. Enclosed between prepreg layer 418b and the top surface of upper PWB 404 is a conductive layer, at ground potential, as indicated by reference numeral 442. Ground layer 442 provides grounding connections to semiconductor die 406.

Separating upper PWB 404 from lower PWB 402 is adhesive layer 422. On the top surface of lower PWB 402 is conductive layer 438, as described above. On the bottom surface of lower PWB 402 is a conductive layer which carries power. This layer, referred to as a power layer, is indicated by reference numeral 440. Power layer 440 provides power connections to semiconductor die 306. Disposed beneath power layer 440 is adhesive layer 414. Preferably, adhesive layer 414 is composed of prepreg layers 414a and 414b which each have a thickness of 0.06 millimeter. Preferably, lower PWB 404 and upper PWB 404 are composed of C-stage material and have thicknesses of 0.20 and 0.10 millimeter, respectively.

C-stage material is a high temperature glass fiber reinforced epoxy laminate. In contrast, prepeg material is an intermediate stage in the reaction of thermosetting resin in which the material softens when subjected to pressure and heat but does not entirely fuse. Prepeg material typically is of the same type of material as is the C-stage material, but only in a partially cured state.

CAVITY DOWN DESIGN

IC package 400 is a "cavity up" IC package since semiconductor die 406 faces away from, and lies directly above, solder balls 416. An alternative preferred embodiment of the present invention is that of a "cavity down" IC package wherein a semiconductor die is opposite to the external connection means.

Figure 5:
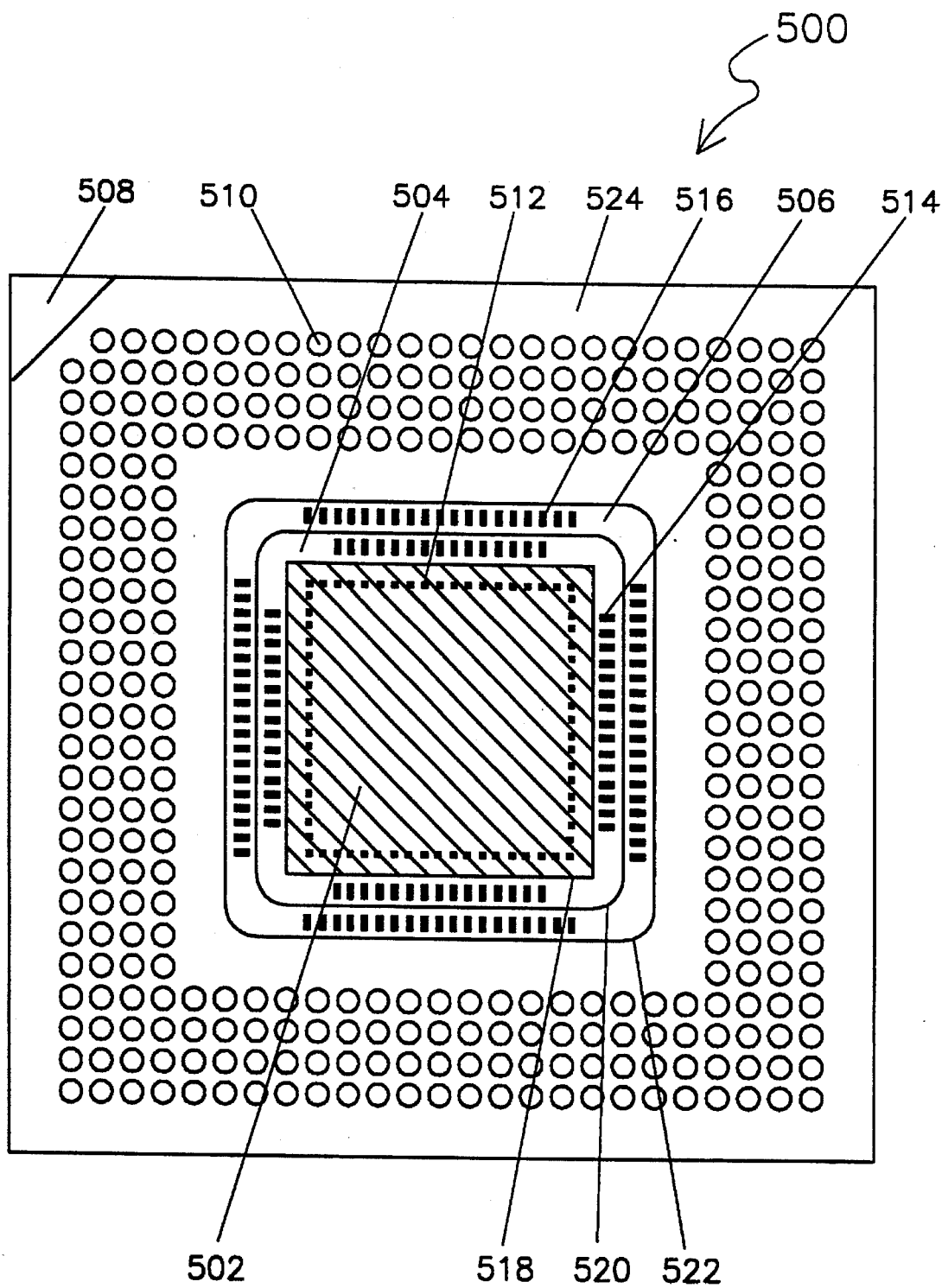
FIG. 5 is a bottom view of a cavity down IC package in accordance with a preferred embodiment of the present invention.

Referring to FIG. 5, a bottom view of a BGA cavity down IC package, in accordance with a preferred embodiment of the present invention, is illustrated. IC package 500 includes semiconductor die 502, PWBs 504, 506 and 508, and solder balls 510. Semiconductor die 502, having bond pads 512 located on its face, is disposed into the tiered cavity formed by the openings 520 and 522 (of PWBs 506 and 508, respectively) and the top surface of PWB 504. Solder balls 510 are disposed on solder ball layer 524 which is, in turn, disposed on PWB 508.

PWBs 504 and 506 have contact pads 514 and 516, respectively, for connection with bond pads 512 of semiconductor die 502. After the connections are made between semiconductor die 502 and contact pads 514 and 516, molding compound (not illustrated) fills in the tiered cavity so as to protect semiconductor die 502 from contamination.

Figure 6:
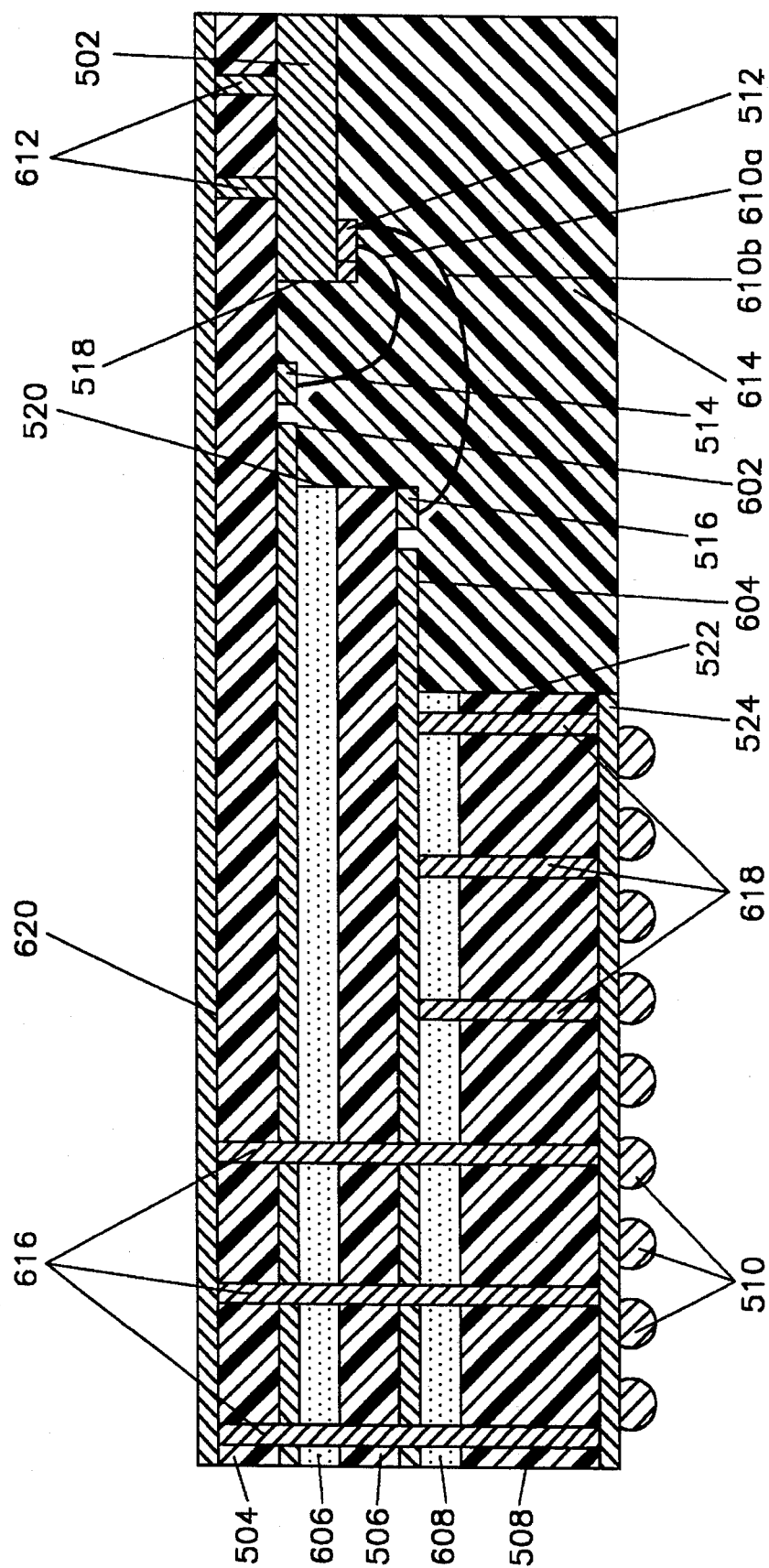
FIG. 6 is a cross-sectional view of the cavity down IC package of FIG. 5 in accordance with a preferred embodiment of the present invention.

Referring to FIG. 6, a cross-sectional view of the BGA cavity down IC package 500 of FIG. 5 is illustrated. IC package 500 includes semiconductor die 502 which is disposed on the top surface of PWB 504. Thermal vias 612 serve to dissipate the heat generated by semiconductor die 502 through metal layer 620. Contact pads 514 are disposed on the bottom surface of PWB 504 and around periphery 518 of semiconductor die 502. This represents the first bonding tier. PWB 504 is laminated to PWB 506 by adhesive layer 606. PWB 506 and adhesive layer 606 have an opening, as indicated by reference numeral 520, which is formed around contact pads 514 of PWB 504. Contact pads 516 are then formed on the bottom surface of PWB 506 and around opening 520. This represents the second bonding tier. Further, PWB 508 is laminated to PWB 506 by adhesive layer 608. PWB 508 and adhesive layer 608 have an opening 522 which provides adequate space for contact pads 516.

PWB 504 possesses contact pads 514 for connection with bond pads 512 of semiconductor die 502. Such connection is accomplished by bond wires 610a. Contact pads 514 are directly connected to conductive layer 602 that is formed on the lower surface of PWB 504. Conductive layer 602 serves to connect contact pads 514 with vias 616. In turn, vias 616 connect with solder ball layer 524. Solder balls 510 are connected with solder ball layer 524 and provide for external connection. Accordingly, signals to and from semiconductor die 502 are passed through bond pads 512, through bond wires 610a, through contact pads 514, through conductive layer 602, through vias 616, and finally through solder balls 510.

Similarly, PWB 506 possesses contact pads 516 for connection with bond pads 512 of semiconductor die 502. Such connection is accomplished by bond wires 610b. Contact pads 516 are directly connected to conductive layer 604 which is formed on the bottom surface of PWB 506. Conductive layer 604 serves to connect contact pads 516 with vias 618. In turn, vias 618 connect with solder ball layer 524. Solder balls 510 are connected with solder ball layer 524 and provide for external connection. Accordingly, signals to and from semiconductor die 502 are passed through bond pads 512, through bond wires 610b, through contact pads 516, through conductive layer 604, through vias 618, and finally through solder balls 510.

Semiconductor die 502 of IC package 500 is encapsulated by a molding compound formed through a transfer molding process. Such molding compound is indicated by reference numeral 614. Encapsulation with a molding compound ensures adequate protection of semiconductor die 502. The end result is an IC package which can be surface mounted for integration within an electronic system.

TRANSFER MOLDING PROCESS

Transfer molding is a unique manner of encapsulating a plastic molding compound so as to form an IC package. Transfer molding provides a great advantage in that the dimensions of the part are better controlled than other known plastic processes. Further, parts formed by transfer molding are relatively inexpensive while high volumes can be realized.

Transfer molding is a process which employs thermosetting polymers, that is, polymers that are plastic or fluid at low temperatures. However, when heated, the polymers react irreversibly and can no longer be melted. A transfer molding press is employed for this process.

Figure 7:
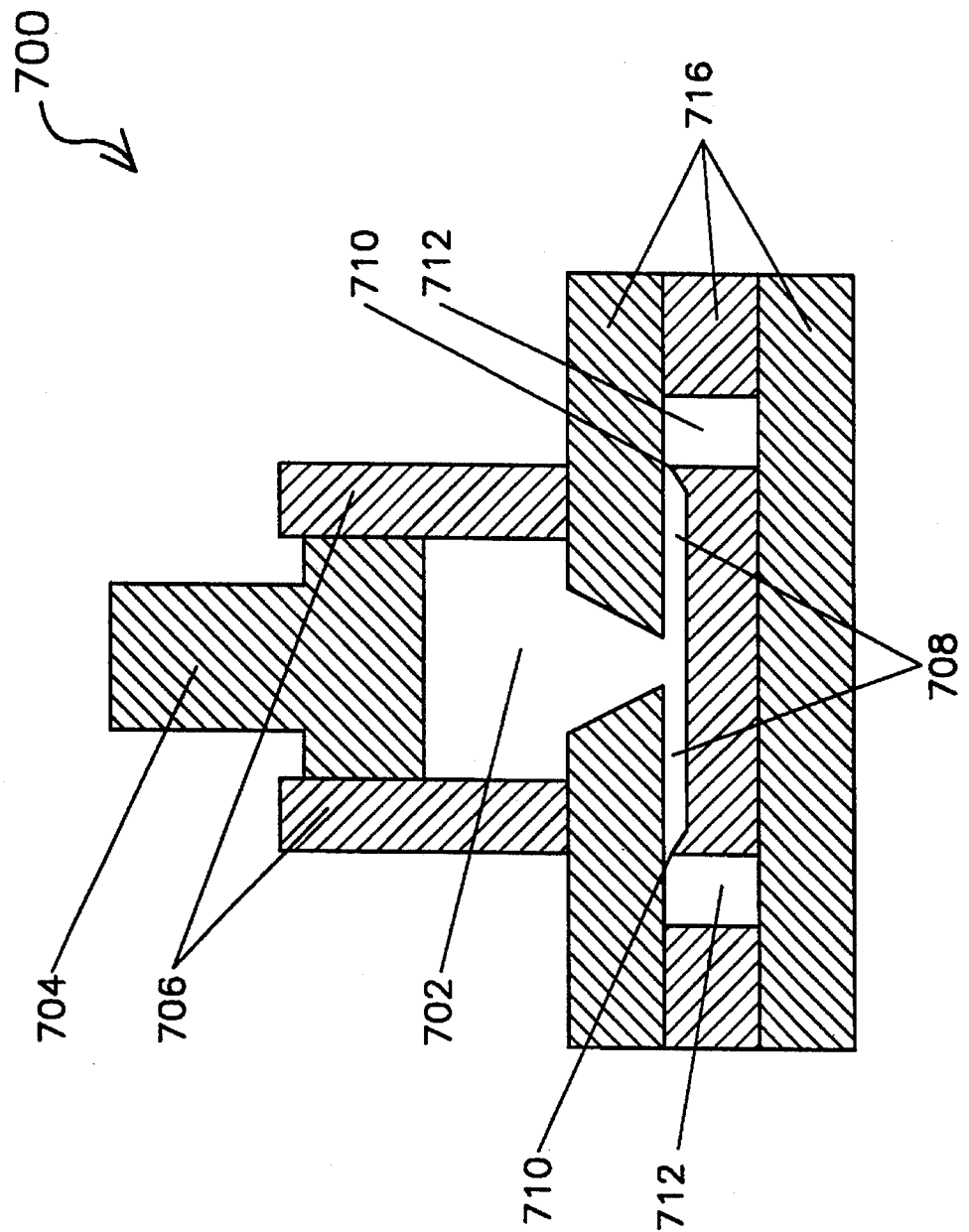
FIG. 7 is a cross-sectional view of a transfer molding press in accordance with a preferred embodiment of the present invention.

Referring to FIG. 7, a transfer molding press is illustrated. Free-flowing granules of molding compound are placed into heated cavity 702 of a transfer molding press 700. Heated cavity 702, often referred to as a pot, is preferably located on the top of mold 716. While within heated cavity 702, the molding compound is placed under pressure and heated so as to liquify the granules of molding compound.

Once the granules sufficiently melt under the pressure and heat, they begin to flow. Molding press 700 is closed by a heated transfer ram which serves to push the liquified molding compound downward. The transfer ram is indicated by reference numeral 704. When transfer ram 704 is pushed downward along sidewalls 706, molding compound is forced into a series of channels called runners as generally indicated by reference numeral 708.

From runners 708, the molding compound passes through a constriction, referred to as a "gate", so as to provide back pressure that serves to slow the flow of molding compound. The gates are generally indicated by reference numeral 710. The gates serve to decrease the velocity and viscosity of the molding compound. This prevents damage to the fragile bondings connecting the semiconductor die to the tiers of contact pads.

Once the materials have passed through gates 710, molding cavities 712, wherein semiconductor dies and PWB assemblies are located (not illustrated), are filled with molding compound. The molding compound then cures to a solid material encapsulant. Cure is completed within one to five minutes, after which mold 716 is opened, the formed IC package ejected, runners 708 cleaned, and the cycle repeated. Molding cavities 712 thus serve to shape the IC package into the desired shape. Mold 716 can contain upwards of 50 molding cavities 712 which define the number of IC packages that can be made at one time.

ASSEMBLY PROCESS

Through an assembly process, the above described IC package can be fabricated in mass quantities. Such an assembly process is disclosed and claimed in a co-pending U.S. patent application Ser. No. 08/106,026 entitled "Panel Processed Full Plane Metal Heat Slug for Reinforced Epoxy Resin Laminate Semiconductor Device Assemblies" by Keith Newman; filed Aug. 31, 1993, and allowed May 3, 1994, and assigned to LSI Logic Corporation, the disclosure of which is hereby incorporated by reference for all purposes.

The system and method of the present invention, therefore, is well adapted to carry out the objects and attain the ends and advantages mentioned, as well as others inherent therein. While preferred embodiments of the invention have been given for purposes of disclosure, numerous changes in the details of construction, interconnection and arrangement of parts will readily suggest themselves to those skilled in the art, and which are encompassed within the spirit of the invention and the scope of the appended claims.

Having thus described our invention, what is claimed as new and desire to secure by Letters Patent is:

1. A method for fabricating an integrated circuit package, comprising:
   (a) laminating printed wiring boards to one another, some of the printed wiring boards having consecutively larger openings so as to form a cavity having two or more bonding tiers, the two or more bonding tiers having contact pads disposed thereon;
   (b) placing a semiconductor die in the cavity, the semiconductor die including bond pads thereon;
   (c) connecting the bond pads of the semiconductor die to the contact pads;
   (d) attaching external connection means to one or more of the laminated printed wiring boards;
   (e) connecting the contact pads to the external connection means;
   (f) placing the semiconductor die and laminated printed wiring boards within a particular one of a plurality of molding cavities, each of the plurality of molding cavities being connected to a central container by a plurality of respective paths;
   (g) placing molding compound within the central container;
   (h) heating and pressurizing the central cavity so as to force the molding compound to flow from the central container, through the plurality of respective paths, and into the particular molding cavity; and
   (i) permitting the molding compound to harden within the particular molding cavity so as to encapsulate the semiconductor die and laminated printed wiring boards with molding compound.

2. The method as recited in claim 1, comprising the further step of constricting the molding compound from entering the particular molding cavity.

3. A method for fabricating an integrated circuit package, comprising:
   (a) laminating printed wiring boards to one another, some of the printed wiring boards having consecutively larger openings so as to form a cavity having two or more bonding tiers, the two or more bonding tiers having contact pads disposed thereon;
   (b) placing a semiconductor die in the cavity, the semiconductor die including bond pads thereon;
   (c) connecting the bond pads of the semiconductor die to the contact pads;
   (d) attaching external connection means to one or more of the laminated printed wiring boards;
   (e) connecting the contact pads to the external connection means by plating vias through the laminated printed wiring boards; and
   (f) encapsulating the semiconductor die and laminated printed wiring boards with molding compound by a transfer molding process.

4. The method as recited in claim 3, wherein encapsulating the semiconductor die and laminated printed wiring boards with molding compound by a transfer molding process, includes applying thermosetting polymers to the semiconductor die and laminated printed wiring boards through a constricted passage.

5. The method as recited in claim 3, wherein the external connection means are an array of metal pins.

6. The method as recited in claim 3, wherein the external connection means are an array of solder balls.

7. The method as recited in claim 3, wherein the contact pads are arranged in a rectangular array on each of the two or more bonding tiers.

8. The method as recited in claim 3 wherein the printed wiring boards comprise completely cured epoxy.

9. A method for fabricating an integrated circuit package, comprising:
   (a) providing a base printed wiring board;
   (b) laminating at least one printed wiring boards having consecutively larger centrally disposed openings to the base printed wiring board so that a centrally located cavity defined by consecutively larger bonding tiers is formed;
   (c) disposing contact pads in the cavity;
   (d) placing a semiconductor die in the cavity and above the base printed wiring board, the semiconductor die having bond pads disposed thereon;
   (e) connecting the bond pads of the semiconductor die to the contact pads through bond wires;
   (f) encapsulating the cavity, including the semiconductor die, the connections between the bond pads and contact pads and a portion of the at least one printed wiring boards but not the periphery of the at least one printed wiring boards, with a molding compound by a transfer molding process.

10. The method as recited in claim 9, wherein the bond wires are substantially parallel with one another.

11. The method as recited in claim 9, further comprising: plating vias through the periphery of the one or more printed wiring boards.

\* \* \* \* \*